(12) United States Patent
Lin et al.

(10) Patent No.: US 11,195,834 B2
(45) Date of Patent: Dec. 7, 2021

(54) SEMICONDUCTOR DEVICE HAVING DEEP WELLS

(71) Applicant: TAIWAN SEMICONDUCTOR MANUFACTURING CO., LTD., Hsinchu (TW)

(72) Inventors: Meng-Han Lin, Hsinchu (TW); Chih-Ren Hsieh, Changhua (TW); Chen-Chin Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/866,506

(22) Filed: May 4, 2020

(65) Prior Publication Data
US 2020/0266196 A1      Aug. 20, 2020

Related U.S. Application Data

(62) Division of application No. 16/195,008, filed on Nov. 19, 2018, now Pat. No. 10,644,000, which is a
(Continued)

(51) Int. Cl.
*H01L 29/76* (2006.01)
*H01L 27/092* (2006.01)
(Continued)

(52) U.S. Cl.
CPC ........ *H01L 27/0928* (2013.01); *H01L 21/266* (2013.01); *H01L 21/761* (2013.01);
(Continued)

(58) Field of Classification Search
CPC ............. H01L 27/0928; H01L 27/0922; H01L 29/1083; H01L 27/11546; H01L 27/11526;
(Continued)

(56) References Cited

U.S. PATENT DOCUMENTS 6,107,672 A    8/2000  Hirase
6,388,295 B1   5/2002  Yamashita et al.
(Continued)

FOREIGN PATENT DOCUMENTS

JP    H11-261021 A    9/1999
JP    2006128499 A    5/2006
(Continued)

OTHER PUBLICATIONS

Office Action issued in corresponding Korean Patent Application No. 10-2016-0181152, dated Jul. 27, 2018.
(Continued)

*Primary Examiner* — Shouxiang Hu
(74) *Attorney, Agent, or Firm* — McDermott Will & Emery LLP

(57) ABSTRACT

A semiconductor device includes first and second voltage device regions and a deep well common to the first and second voltage device regions. An operation voltage of electronic devices in the second voltage device region is higher than that of electronic devices in the first voltage device region. The deep well has a first conductivity type. The first voltage device region includes a first well having the second conductivity type and a second well having the first conductivity type. The second voltage region includes a third well having a second conductivity type and a fourth well having the first conductivity type. A second deep well having the second conductivity type is formed below the fourth well. The first, second and third wells are in contact with the first deep well, and the fourth well is separated by the second deep well from the first deep well.

20 Claims, 11 Drawing Sheets

Related U.S. Application Data division of application No. 15/782,588, filed on Oct. 12, 2017, now Pat. No. 10,134,644, which is a division of application No. 15/278,812, filed on Sep. 28, 2016, now Pat. No. 9,831,134.

(51) Int. Cl.

| | | |
|---|---|---|
| *H01L 27/11546* | (2017.01) | |
| *H01L 27/11526* | (2017.01) | |
| *H01L 27/11575* | (2017.01) | |
| *H01L 29/10* | (2006.01) | |
| *H01L 21/266* | (2006.01) | |
| *H01L 21/761* | (2006.01) | |
| *H01L 21/762* | (2006.01) | |
| *H01L 21/8234* | (2006.01) | |
| *H01L 21/8238* | (2006.01) | |

(52) U.S. Cl.
CPC .......... *H01L 21/76224* (2013.01); *H01L 21/823481* (2013.01); *H01L 21/823493* (2013.01); *H01L 21/823878* (2013.01); *H01L 21/823892* (2013.01); *H01L 27/0922* (2013.01); *H01L 27/11526* (2013.01); *H01L 27/11546* (2013.01); *H01L 27/11575* (2013.01); *H01L 29/1083* (2013.01)

(58) Field of Classification Search
CPC ......... H01L 27/11573; H01L 27/11575; H01L 21/823892; H01L 21/823878; H01L 21/823493; H01L 21/823481; H01L 21/76224; H01L 21/761; H01L 21/266; H01L 27/04; H01L 21/82; H01L 21/76859; H01L 21/31155; H01L 21/265; H01L 21/0415; H01L 21/0337
See application file for complete search history.

(56) References Cited

U.S. PATENT DOCUMENTS

| | | | |
|---|---|---|---|
| 6,838,328 B1 | 1/2005 | Burr | |
| 7,091,079 B2* | 8/2006 | Chen | ............... H01L 21/823814 257/E21.634 |
| 9,673,187 B2* | 6/2017 | Salcedo | ............... H01L 27/0207 |
| 2002/0135022 A1 | 9/2002 | Igaue et al. | |
| 2002/0182805 A1 | 12/2002 | Hsu et al. | |
| 2004/0026743 A1 | 2/2004 | Shibata et al. | |
| 2004/0252541 A1* | 12/2004 | Yang | .................... H01L 27/115 365/102 |
| 2005/0104098 A1 | 5/2005 | Yasuoka et al. | |
| 2005/0118759 A1 | 6/2005 | Noda et al. | |
| 2006/0099753 A1 | 5/2006 | Chen et al. | |
| 2006/0267103 A1 | 11/2006 | Tanaka | |
| 2007/0273001 A1 | 11/2007 | Chen et al. | |
| 2010/0230749 A1 | 9/2010 | Chiang et al. | |
| 2011/0248342 A1 | 10/2011 | Kim et al. | |
| 2013/0299915 A1 | 11/2013 | Voldman | |
| 2013/0320498 A1* | 12/2013 | Salcedo | .............. H01L 27/0921 257/565 |
| 2014/0339601 A1 | 11/2014 | Salcedo et al. | |

FOREIGN PATENT DOCUMENTS

| | | |
|---|---|---|
| JP | 2007-005763 A | 1/2007 |
| JP | 2014033072 A | 2/2014 |
| KR | 20000048212 A | 7/2000 |
| KR | 20110112642 A | 10/2011 |
| TW | 563243 B | 11/2003 |
| TW | 200818460 A | 4/2008 |
| TW | 201212205 A | 3/2012 |

OTHER PUBLICATIONS

Office Action issued in corresponding Taiwanese Patent Application No. 10620490460 dated May 5, 2017.
Notice of Allowance issued in related U.S. Appl. No. 15/782,588, dated Jul. 3, 2018.
Corrected Notice of Allowability issued in related U.S. Appl. No. 15/782,588, dated Oct. 22, 2018.
Notice of Allowance issued in related U.S. Appl. No. 15/278,812, dated Jul. 14, 2017.
Non-Final Office Action issued in related U.S. Appl. No. 15/278,812, dated Mar. 2, 2017.
Notice of Allowance issued in related Korean Patent Application No. 10-2019-0030015, dated May 1, 2019.
Non-Final Office Action issued in related U.S. Appl. No. 16/195,008, dated Sep. 19, 2019.
Notice of Allowance issued in related U.S. Appl. No. 16/195,008, dated Jan. 2, 2020.

* cited by examiner

US 11,195,834 B2

SEMICONDUCTOR DEVICE HAVING DEEP WELLS

CROSS REFERENCE TO RELATED APPLICATIONS

This Application is a Divisional Application of U.S. Ser. No. 16/195,008 filed Nov. 19, 2018, now U.S. Pat. No. 10,644,000, which is a Divisional Application of U.S. Ser. No. 15/782,588 filed Oct. 12, 2017, now U.S. Pat. No. 10,134,644, which is a Divisional Application of U.S. Ser. No. 15/278,812, filed Sep. 28, 2016, now U.S. Pat. No. 9,831,134, the disclosures of each of which are incorporated herein by reference in entirety.

TECHNICAL FIELD

The disclosure relates to semiconductor integrated circuits, and more particularly to semiconductor devices having multiple operation voltage devices and their manufacturing processes.

BACKGROUND

Some semiconductor devices include multiple operation voltage devices, such as an embedded flash memory, a high-voltage FET (field effect transistor), and bipolar-CMOS (complementary metal-oxide-semiconductor)-DMOS (diffused MOS) devices, integrated on one semiconductor chip. Devices having different operation voltages are electrically isolated by adequate technologies. It has been required to isolate wells having different potentials without increasing cell area and process cost.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The devices may be otherwise oriented (rotated 90 degrees or at other orientations) and the spatially relative descriptors used herein may likewise be interpreted accordingly. In addition, the term "made of" may mean either "comprising" or "consisting of."

FIGS. 1-7 show exemplary cross sectional views illustrating a manufacturing method for a semiconductor device having multiple operation voltages. It is understood that additional operations can be provided before, during, and after processes shown by FIGS. 1-7, and some of the operations described below can be replaced or eliminated, for additional embodiments of the method. The order of the operations/processes may be interchangeable.

Figure 1:
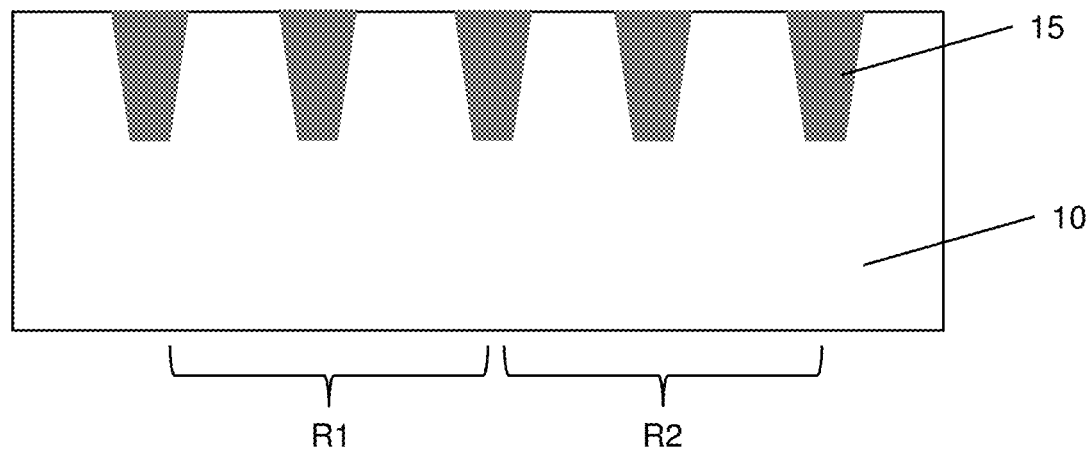
FIGS. 1, 2, 3, 4, 5, 6 and 7 show exemplary cross sectional views illustrating a manufacturing operation for a semiconductor device having multiple operation voltages according to one embodiment of the present disclosure.

FIG. 1 is an exemplary cross sectional view of one of the stages of the manufacturing method for a semiconductor device according to one embodiment of the present disclosure.

In this embodiment, the semiconductor device includes a first voltage device region R1 and a second voltage device region R2, and an operation voltage of the devices (e.g., field effect transistors) in the first voltage device region R1 is lower than that of the second voltage device region R2.

As shown in FIG. 1, isolation regions 15 are formed in a substrate 10. The isolation regions 15 are also called shallow trench isolation (STI). The isolation regions 15 are formed by trench etching the substrate 10 and filling the trenches with an insulating material. The isolation regions are made of, for example, one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. The isolation regions may be formed by one or more layers of SOG, SiO, SiON, SiOCN and/or fluorine-doped silicate glass (FSG) in some embodiments.

After the insulating material is formed in and over the tranches, a planarization operation, such as a chemical mechanical polishing (CMP) process and an etch-back process, is performed to planarize the upper surface. A depth of the isolation regions 15 is in a range from about 10 nm to about 1000 nm in some embodiments.

The substrate 10 is silicon substrate in one embodiment, and is appropriately doped. The substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof.

Although the isolation regions 15 are illustrated as the same size, this is merely illustrative and the isolation regions may be different sizes. For example, the isolation region between the first voltage device region R1 and the second voltage device region R2 may be larger than the isolation regions within one voltage region.

Figure 2:
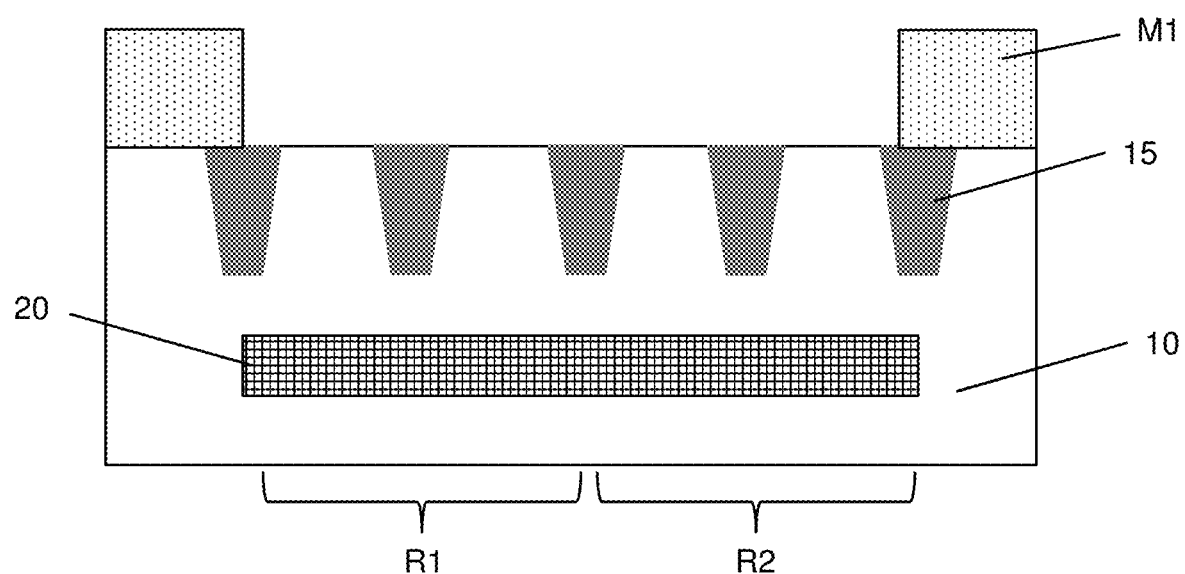

FIG. 2 is an exemplary cross sectional view of one of the stages of manufacturing semiconductor device according to one embodiment of the present disclosure.

After the isolation regions 15 are formed, a first deep well 20 having a first conductivity type is formed in the substrate 10 having a second conductivity type. As shown in FIG. 2, the first deep well 20 can be formed by ion implantation with a first resist mask pattern M1. The first resist mask pattern M1 can be formed by lithography operations. In this embodiment, the first conductivity type is n-type and the second conductivity type is p-type. Of course, opposite conductivity types can be employed, and modifications of the following operations in such a case are omitted.

The first deep well 20 (DNW) is doped with one or more of P, As and Sb, and the ions thereof are implanted at an acceleration voltage in a range from about 600 KeV to about 5 MeV, in some embodiments. A dose amount is in a range from about $1.0 \times 10^{11}$ cm$^{-2}$ to about $1.0 \times 10^{14}$ cm$^{-2}$ in some embodiments. The first deep well 20 is formed at a depth of about 1.0-5.0 μm from the surface of the substrate 10 in some embodiments.

As shown in FIG. 2, the first deep well 20 is formed commonly in the first voltage device region R1 and the second voltage region R2. In other words, one first deep well 20 is shared by the first voltage device region R1 and the second voltage region R2. After the ion implantation, the first resist mask pattern M1 is removed by ashing and the substrate is subjected to a cleaning operation in some embodiments.

Figure 3:
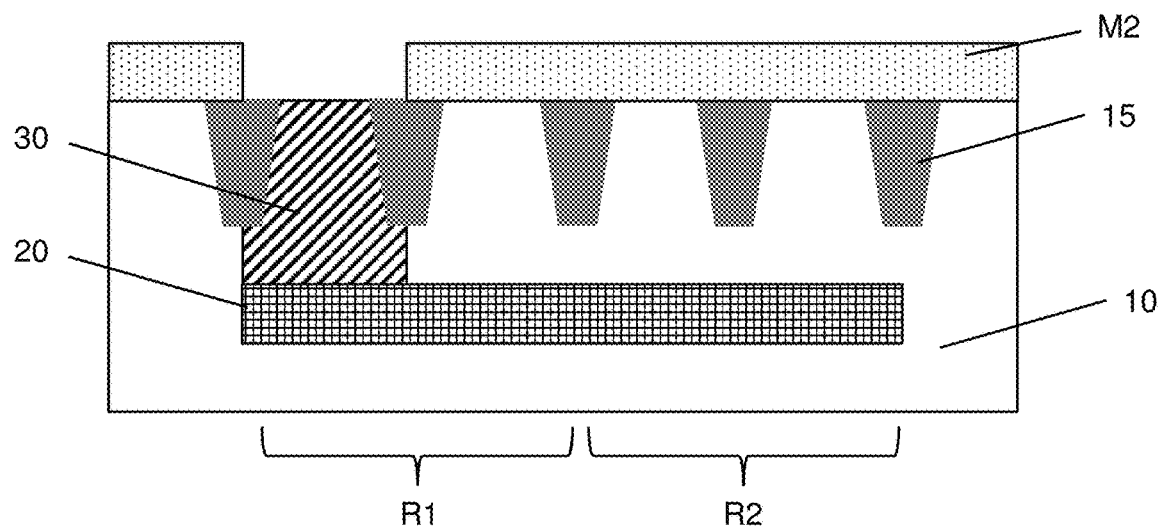

FIG. 3 is an exemplary cross sectional view of one of the stages of manufacturing semiconductor device according to one embodiment of the present disclosure.

After the first deep well 20 (DNW) is formed, a first well 30 (PW1) having the second conductivity type is formed in the first voltage device region R1, by a second ion implantation using a second resist mask pattern M2.

The first well 30 is doped with one or more of B and BF2, and the ions thereof are implanted at an acceleration voltage in a range from about 10 KeV to about 1 MeV, in some embodiments. A dose amount is in a range from about $1.0 \times 10^{12}$ cm$^{-2}$ to about $1.0 \times 10^{14}$ cm$^{-2}$ in some embodiments. The first well 30 is formed to a depth of about 0.5-2.0 μm from the surface of the substrate 10 in some embodiments. As shown in FIG. 3, the first well 30 is in contact with the first deep well 20. After the ion implantation, the second resist mask pattern M2 is removed by ashing and the substrate is subjected to a cleaning operation in some embodiments.

Figure 4:
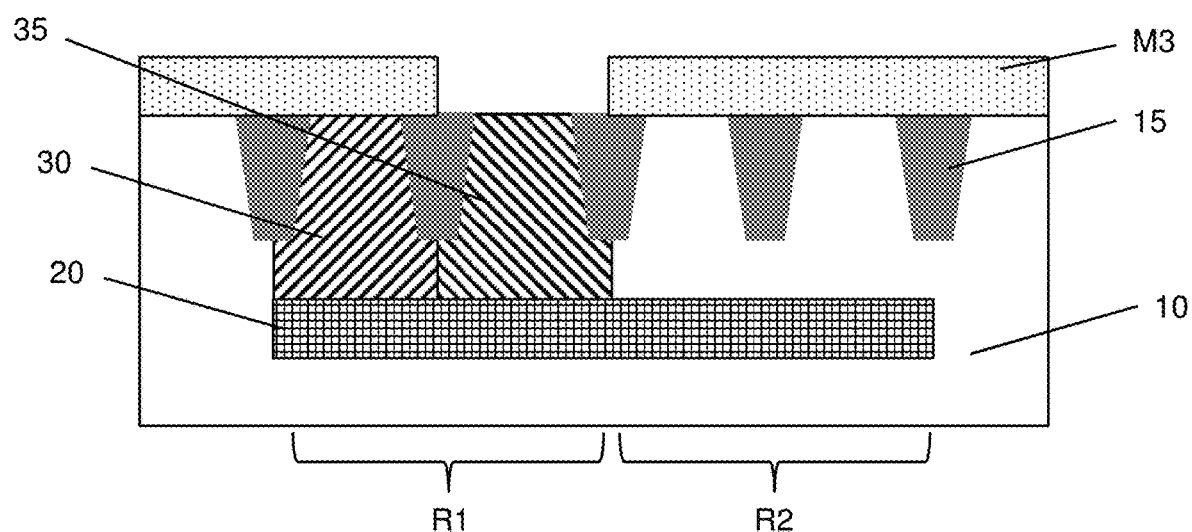

FIG. 4 is an exemplary cross sectional view of one of the stages of manufacturing semiconductor device according to one embodiment of the present disclosure.

After the first well 30 (PW1) is formed, a second well 35 (NW1) having the first conductivity type is formed in the first voltage device region R1, by a third ion implantation using a third resist mask pattern M3.

The second well 35 is doped with one or more of P, As and Sb, and the ions thereof are implanted at an acceleration voltage in a range from about 10 KeV to about 1 MeV, in some embodiments. A dose amount is in a range from about $1.0 \times 10^{12}$ cm$^{-2}$ to about $1.0 \times 10^{14}$ cm$^{-2}$ in some embodiments. The second well 35 is formed at a depth of about 0.5-2.0 μm from the surface of the substrate 10 in some embodiments. As shown in FIG. 4, the second well 35 is in contact with the first deep well 20. After the ion implantation, the third resist mask pattern M3 is removed by ashing and the substrate is subjected to a cleaning operation in some embodiments.

Figure 5:
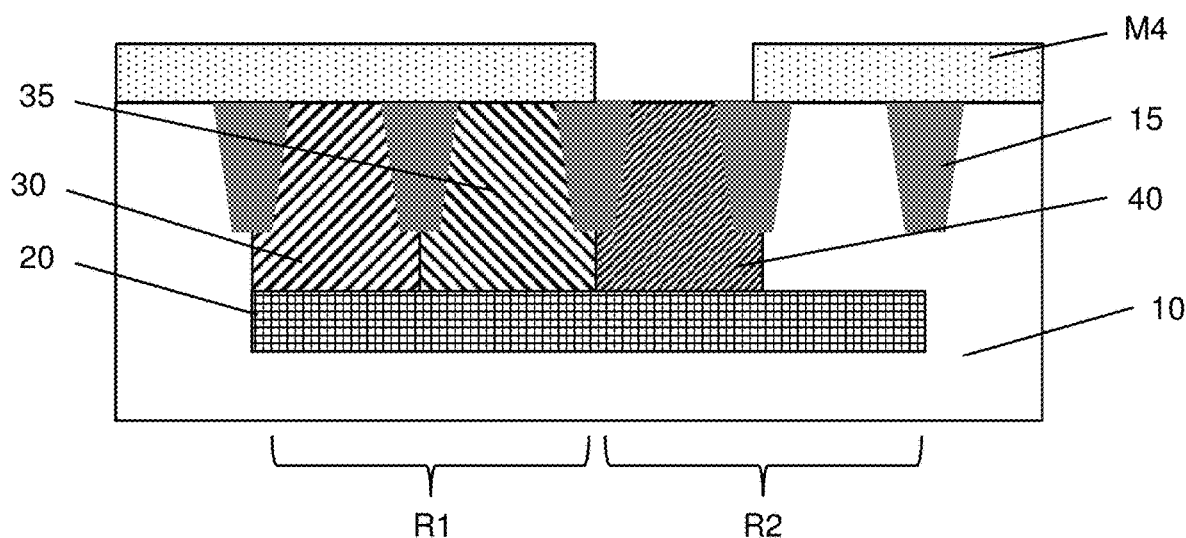

FIG. 5 is an exemplary cross sectional view of one of the stages of manufacturing semiconductor device according to one embodiment of the present disclosure.

After the second well 35 (NW1) is formed, a third well 40 (PW1) having the second conductivity type is formed in the second voltage device region R2, by a fourth ion implantation using a fourth resist mask pattern M4.

The third well 40 is doped with one or more of B and BF2, and the ions thereof are implanted at an acceleration voltage in a range from about 10 KeV to about 1 MeV, in some embodiments. A dose amount is in a range from about $1.0 \times 10^{12}$ cm$^{-2}$ to about $1.0 \times 10^{14}$ cm$^{-2}$ in some embodiments. The third well 40 is formed to a depth of about 0.5-2.0 μm from the surface of the substrate 10 in some embodiments. As shown in FIG. 5, the third well 40 is in contact with the first deep well 20. After the ion implantation, the fourth resist mask pattern M4 is removed by ashing and the substrate is subjected to a cleaning operation in some embodiments.

Figure 6:
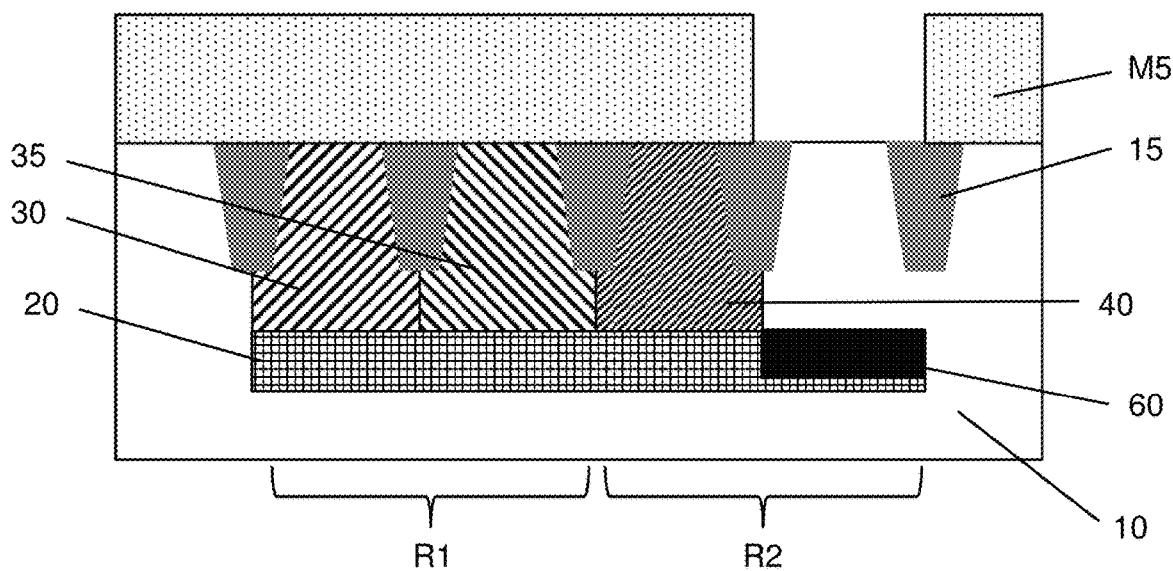

FIG. 6 is an exemplary cross sectional view of one of the stages of manufacturing semiconductor device according to one embodiment of the present disclosure.

After the third well 40 (PW2) is formed, a fifth ion implantation is performed by using a fifth resist mask pattern M5, thereby forming a second deep well 60 (DPW) having the second conductivity type in the second voltage device region R2, as shown in FIG. 6.

The second deep well 60 is doped with one or more of B and BF2, and the ions thereof are implanted at an acceleration voltage in a range from about 100 KeV to about 3 MeV, in some embodiments. A dose amount is in a range from about $1.0 \times 10^{11}$ cm$^{-2}$ to about $1.0 \times 10^{14}$ cm$^{-2}$ in some embodiments. The second deep well 60 is formed to a depth of about 1.0-4.0 μm from the surface of the substrate 10 in some embodiments.

Figure 7:
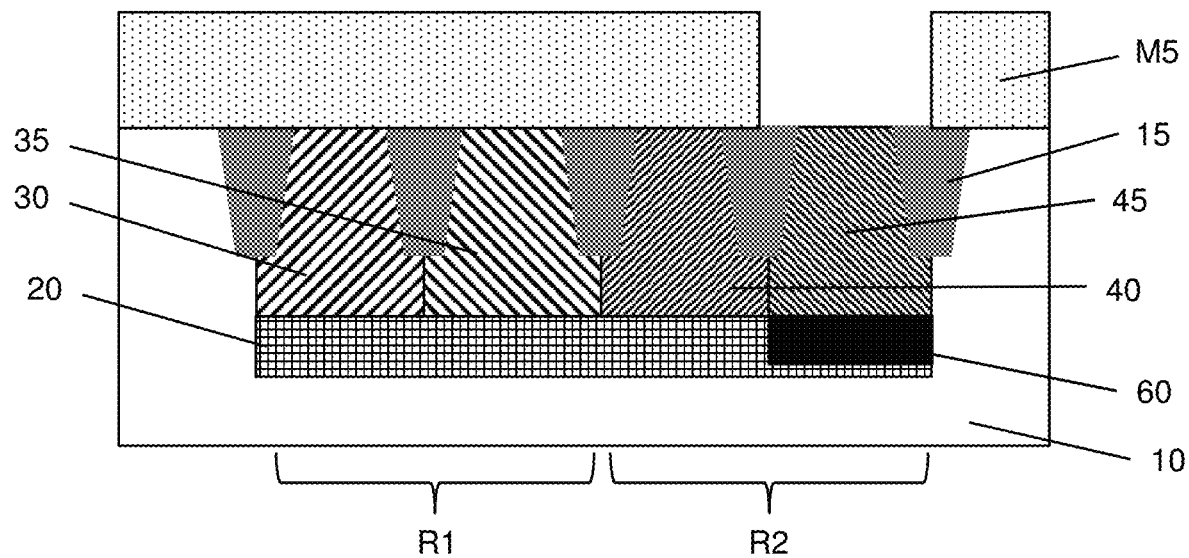

FIG. 7 is an exemplary cross sectional view of one of the stages of manufacturing semiconductor device according to one embodiment of the present disclosure.

After the fifth ion implantation by using the resist mask pattern M5, a sixth ion implantation is performed by using the same resist mask pattern M5 (without removing), thereby forming a fourth well 45 (NW2) having the first conductivity type in the second voltage device region R2.

The fourth well 45 is doped with one or more of P, As and Sb, and the ions thereof are implanted at an acceleration voltage in a range from about 10 KeV to about 1 MeV, in some embodiments. A dose amount is in a range from about $1.0 \times 10^{12}$ cm$^{-2}$ to about $1.0 \times 10^{14}$ cm$^{-2}$ in some embodiments. The fourth well 45 is formed to a depth of about 0.5-2.0 µm from the surface of the substrate 10 in some embodiments. As shown in FIG. 7, the fourth well 45 is in contact with the first deep well 20.

As shown in FIG. 7, the second deep well 60 is in contact with the fourth well 45 and the first deep well 20. Thus, the fourth well 45 is separated by the second deep well 60 from the first deep well 20.

In some embodiments, the bottom of the second deep well 60 is shallower than the bottom of the first deep well 20. In certain embodiments, the bottom of the second deep well 60 is equal to or deeper than the bottom of the first deep well 20. After the sixth ion implantation, the fifth resist mask pattern M5 is removed by ashing and the substrate is subjected to a cleaning operation in some embodiments.

In the foregoing operations, a thickness of the first and fifth resist mask patterns M1, M5 are greater than a thickness of each of the second and third resist mask patterns M2 and M3, because a higher implantation energy is required to form deep wells than first and second wells.

A thickness of the fifth resist mask pattern M5 can be equal to or greater than a thickness of the fourth resist mask pattern M4. In view of the implantation energy, the fourth resist mask pattern can be as thin as the thickness of the second and third resist mask patterns M2 and M3. However, since size of the devices in the second voltage device region R2 is generally larger than those in the first voltage device region R1 and/or a density of the devices in the second voltage device region R2 is generally smaller than those in the first device voltage region R1, the resist mask pattern for the second device voltage region R2 can be larger (coarser) than that for the first device voltage region R1. Accordingly, it is possible to set the thickness of the fourth resist mask pattern M4 greater or equal to the fifth resist mask pattern M5.

By the same reasons, the thickness of the fifth resist mask pattern M5 for the second device voltage region R2 can be set thicker. Accordingly, the same mask pattern M5 can be used for a relatively high energy ion implantation (the fifth ion implantation) and a relatively low energy ion implantation (the sixth ion implantation).

After the wells are formed, MOS FETs 100 (see, FIG. 8) and other devices are formed on the substrate 10.

Figure 8:
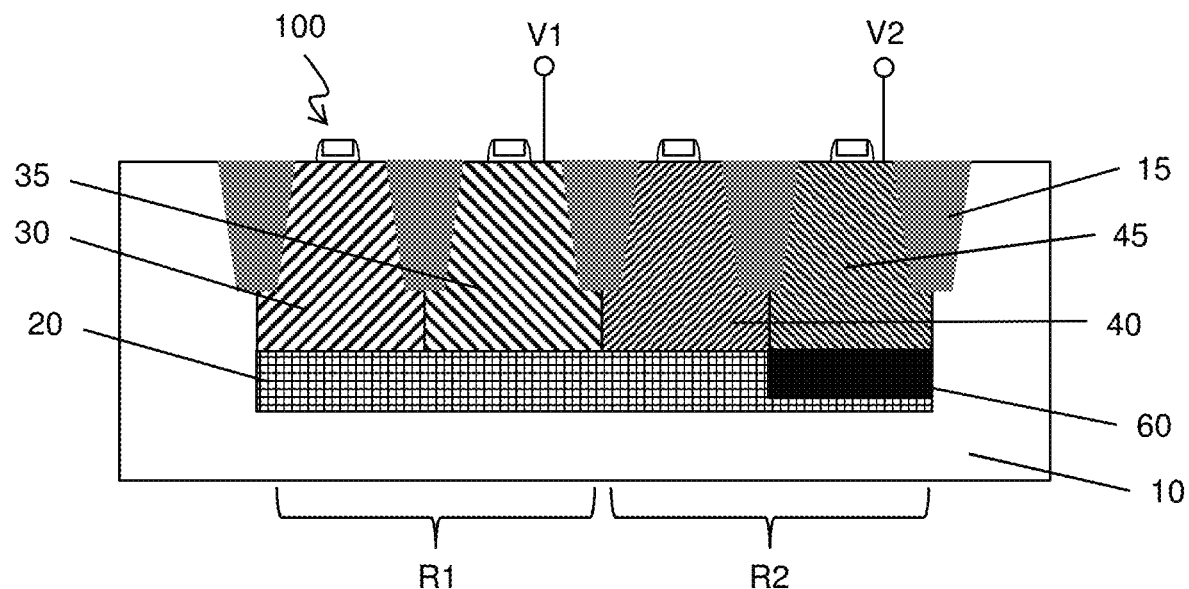
FIG. 8 shows advantageous effects of the present embodiment.

FIG. 8 shows advantageous effects of the present embodiment. According to the structure shown in FIG. 8, which is one embodiment of the present disclosure, the fourth well 45 (NW2) is electrically connected to a positive power supply V2, while the second well 35 (NW1) is electrically connected to another positive power supply V1, where V1<V2. In FIG. 8, since the second deep well 60 having the second conductivity type (p-type) is disposed between the fourth well 45 having the first conductivity type (n-type) and the first deep well 20 (n-type), the fourth well (NW2) is electrically separated from the first deep well 20 and the second well 35 (an n-p-n structure). Thus, even if V2 is higher than V1, no current flows from the fourth well 45 toward the second well 35.

In contrast, if no second deep well is formed, there will be a leakage path between the fourth well 45 and the second well 35, all n-type wells, and when V1 is not equal to V2, a current flows on the leakage path.

In another alternative configuration, the first deep well is divided into a first first-well in the first device voltage region R1 and a second first-well in the second device voltage region R2, separated by a space region (p-type substrate). Further, another second conductivity type well (a p-type well) is formed over the boundary of the first device voltage region R1 and the second device voltage region R2. The p-type well can be formed at the same time as the first well 30. Because of the space and the p-type well, there is no leakage path between the fourth well 45 and the second well 35. Compared with the structure of FIG. 8, however, this configuration requires more area than that of FIG. 8. The device area of the device shown in FIG. 8 is about 10-45% less than that this alternative configuration.

Figure 9:
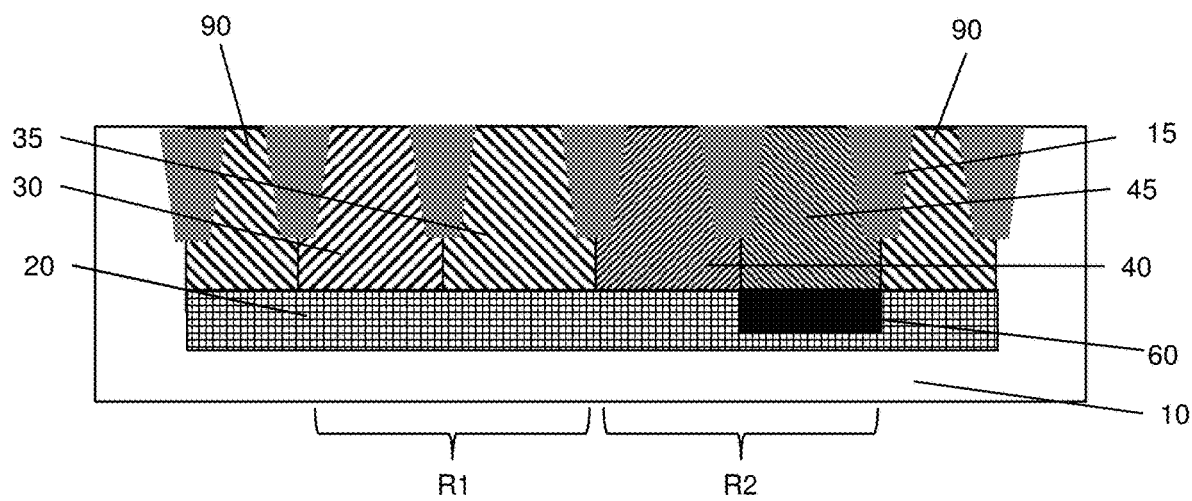
FIG. 9 shows an exemplary cross sectional view of a semiconductor device having multiple operation voltages according to another embodiment of the present disclosure.

In the foregoing embodiments, the first to sixth ion implantations (using five resist mask patterns) are performed in this order. In particular, a higher energy ion implantation is generally performed prior to a lower energy ion implantation. According, the first ion implantation for the first deep well 20 is performed prior to the second to sixth ion implantation, and the fifth ion implantation for the second deep well 60 is performed prior to the sixth ion implantation for the fourth well 45. In certain embodiment, a DNW pick-up ring structure, i.e., a ring shape n-well 90 connected to the DNW 20, is formed surrounding the second to fifth wells (regions R1 and R2), as shown in FIG. 9. In such a case, the ion implantation for the DNW 20 is performed prior to the DPW 60 ion implantation.

However, the order of the second, third, fourth and sixth ion implantations are not limited to this. For example, the order of the second, third, fourth and sixth ion implantations can be any order, while the fifth ion implantation is performed just before the sixth ion implantation. In certain embodiments, the combination of the fifth and sixth ion implantation is performed prior to the second, third and fourth ion implantations.

In the foregoing embodiments, the fifth and sixth ion implantations utilize the same resist mask pattern. However, it is possible to use a separate resist mask pattern (i.e., a sixth resist mask pattern) for the sixth ion implantation. In such a case, the first and fifth ion implantations for the first and second deep wells (DNW and DPW) are performed prior to the second (PW1), third (NW1), fourth (PW2) and sixth (NW2) ion implantations. In some embodiments, the first ion implantation is performed prior to the fifth ion implantation.

FIGS. 10-17 show exemplary cross sectional views illustrating a manufacturing method for a semiconductor device having multiple operation voltages. It is understood that additional operations can be provided before, during, and after processes shown by FIGS. 10-17, and some of the operations described below can be replaced or eliminated, for additional embodiments of the method. The order of the operations/processes may be interchangeable. The structures, configuration, operations, processes and materials explained with FIGS. 1-7 may be applied to the following embodiments and the details thereof may be omitted.

In this embodiment, the semiconductor device includes a first voltage device region R1, a second voltage device region R2 and a third voltage device region R3, and an operation voltage of the devices (e.g., field effect transistors) in the first voltage device region R1 is lower than that of the second voltage device region R2, and the operation voltage of the devices in the second voltage device region R2 is lower than that of the third voltage device region R3.

Figure 10:
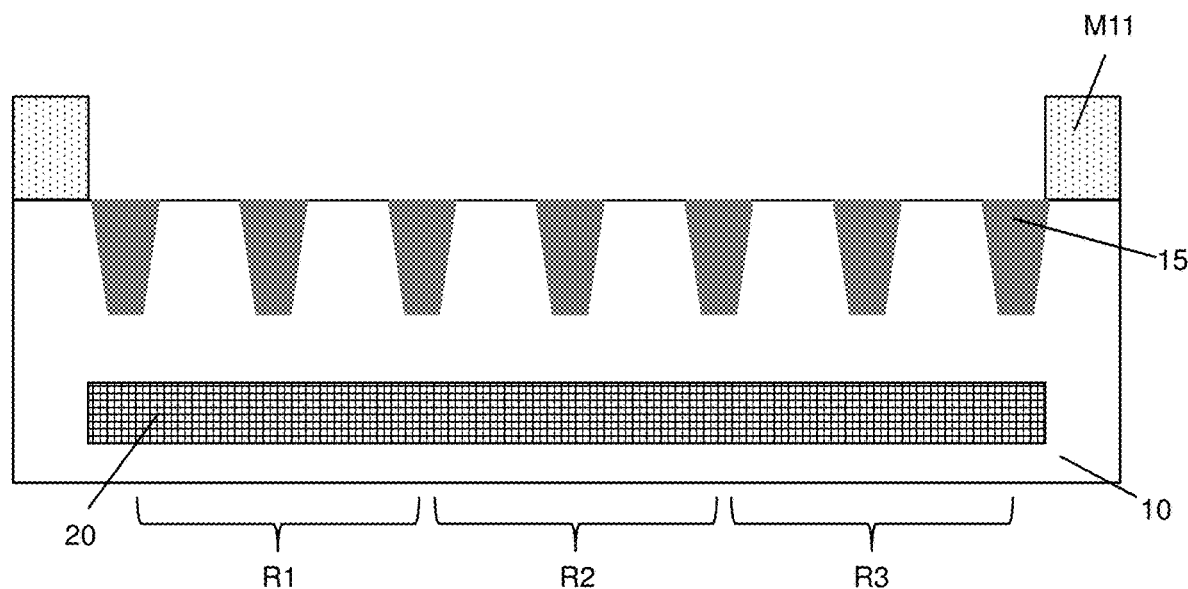
FIGS. 10, 11, 12, 13, 14, 15, 16 and 17 show exemplary cross sectional views illustrating a manufacturing method for a semiconductor device having multiple operation voltages according to another embodiment of the present disclosure.

FIG. 10 is an exemplary cross sectional view of one of the stages of manufacturing semiconductor device according to one embodiment of the present disclosure.

After the isolation regions 15 are formed, a first deep well 20 having a first conductivity type is formed in the substrate 10 having a second conductivity type. As shown in FIG. 10, the first deep well 20 can be formed by ion implantation with a first resist mask pattern M11. The first resist mask pattern M11 can be formed by lithography operations. In this embodiment, the first conductivity type is n-type and the second conductivity type is p-type. Of course, opposite conductivity types can be employed, and modifications of the following operations in such a case are omitted.

The first deep well 20 (DNW) is doped with one or more of P, As and Sb, and the ions thereof are implanted at an acceleration voltage in a range from about 600 KeV to about 5 MeV, in some embodiments. A dose amount is in a range from about $1.0 \times 10^{11}$ cm$^{-2}$ to about $1.0 \times 10^{14}$ cm$^{-2}$ in some embodiments. The first deep well 20 is formed at a depth of about 1.0-5.0 μm from the surface of the substrate 10 in some embodiments.

As shown in FIG. 10, the first deep well 20 is formed commonly in the first to third voltage device regions R1-R3. In other words, one first deep well 20 is shared by the first to third voltage device regions R1-R3. After the ion implantation, the first resist mask pattern M11 is removed by ashing and the substrate is subjected to a cleaning operation in some embodiments.

Figure 11:
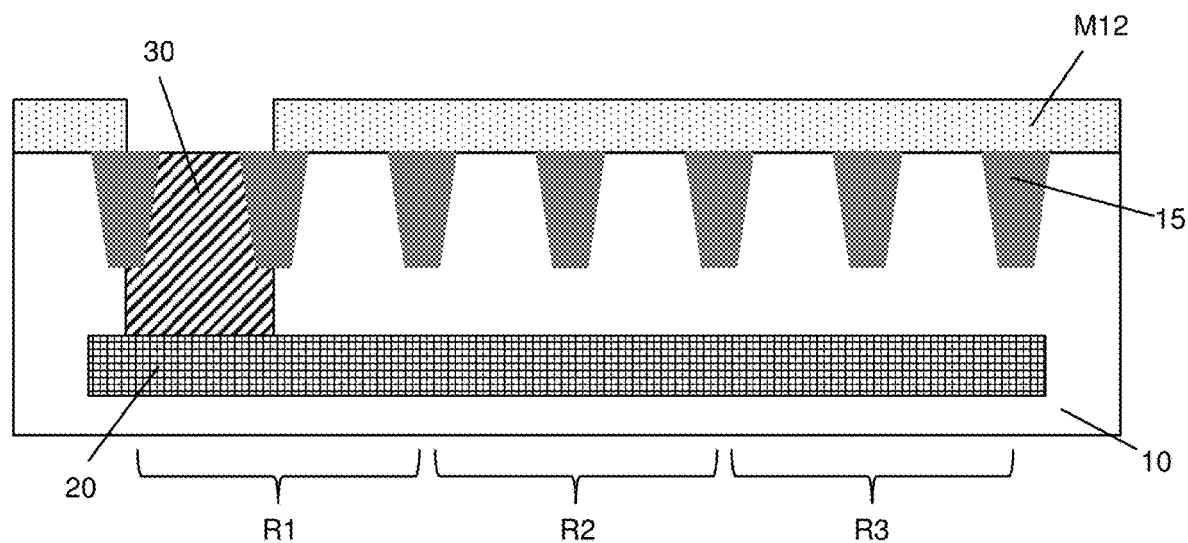

FIG. 11 is an exemplary cross sectional view of one of the stages of manufacturing semiconductor device according to one embodiment of the present disclosure.

After the first deep well 20 (DNW) is formed, a first p-well 30 (PW1) is formed in the first voltage device region R1, by a PW1 ion implantation using a PW1 resist mask pattern M12.

The PW1 30 is doped with one or more of B and BF2, and the ions thereof are implanted at an acceleration voltage in a range from about 10 KeV to about 1 MeV, in some embodiments. A dose amount is in a range from about $1.0 \times 10^{12}$ cm$^{-2}$ to about $1.0 \times 10^{14}$ cm$^{-2}$ in some embodiments. The PW1 30 is formed to a depth of about 0.5-2.0 μm from the surface of the substrate 10 in some embodiments. As shown in FIG. 11, the PW1 30 is in contact with the first deep well 20. After the ion implantation, the PW1 resist mask pattern M12 is removed by ashing and the substrate is subjected to a cleaning operation in some embodiments.

Figure 12:
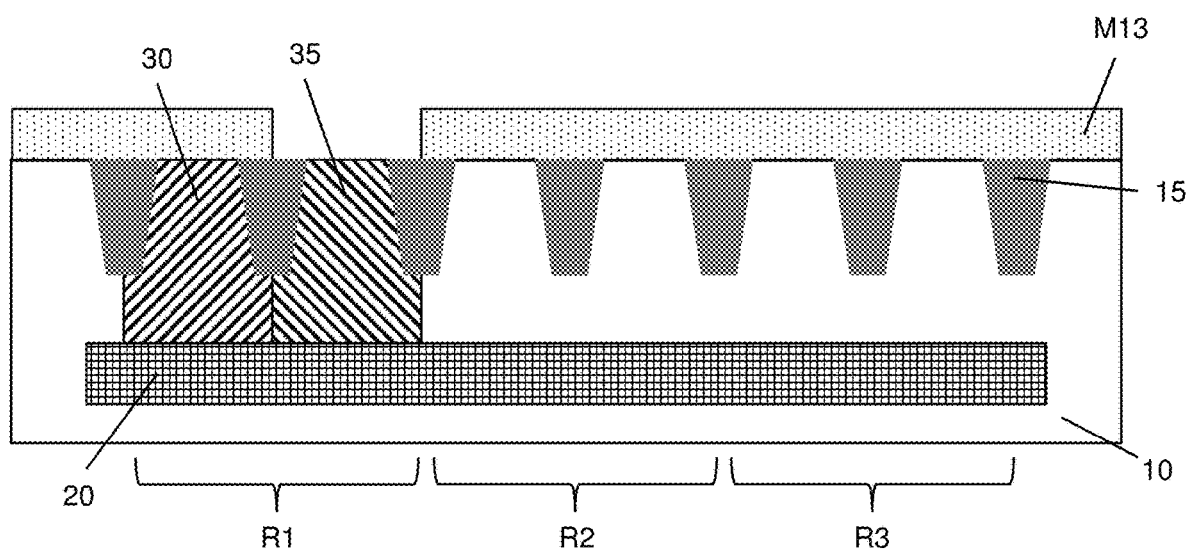

FIG. 12 is an exemplary cross sectional view of one of the stages of manufacturing semiconductor device according to one embodiment of the present disclosure.

After the PW1 30 is formed, a first n-well 35 (NW1) is formed in the first voltage device region R1, by an NW1 ion implantation using an NW1 resist mask pattern M13.

The NW1 35 is doped with one or more of P, As and Sb, and the ions thereof are implanted at an acceleration voltage in a range from about 10 KeV to about 1 MeV, in some embodiments. A dose amount is in a range from about $1.0 \times 10^{12}$ cm$^{-2}$ to about $1.0 \times 10^{14}$ cm$^{-2}$ in some embodiments. The NW1 35 is formed to a depth of about 0.5-2.0 μm from the surface of the substrate 10 in some embodiments. As shown in FIG. 12, the NW1 35 is in contact with the first deep well 20. After the ion implantation, the NW1 resist mask pattern M13 is removed by ashing and the substrate is subjected to a cleaning operation in some embodiments.

Figure 13:
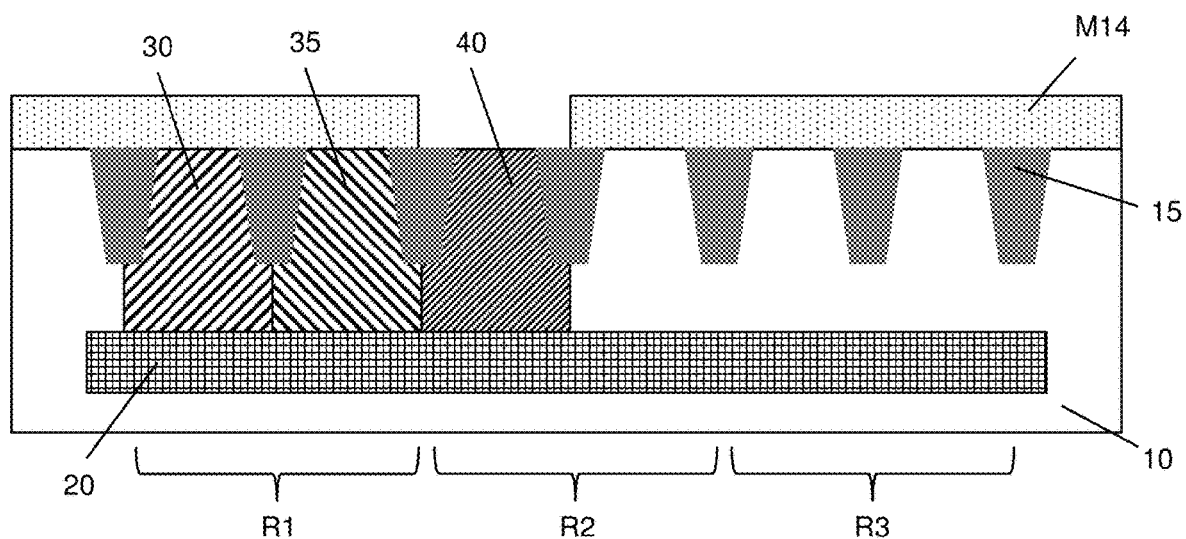

FIG. 13 is an exemplary cross sectional view of one of the stages of manufacturing semiconductor device according to one embodiment of the present disclosure.

After the NW1 35 is formed, a second p-well 40 (PW2) is formed in the second voltage device region R2, by a PW2 ion implantation using a PW2 resist mask pattern M14.

The PW2 40 is doped with one or more of B and BF2, and the ions thereof are implanted at an acceleration voltage in a range from about 10 KeV to about 1 MeV, in some embodiments. A dose amount is in a range from about $1.0 \times 10^{12}$ cm$^{-2}$ to about $1.0 \times 10^{14}$ cm$^{-2}$ in some embodiments. The PW2 40 is formed to a depth of about 0.5-2.0 μm from the surface of the substrate 10 in some embodiments. As shown in FIG. 13, the PW2 40 is in contact with the first deep well 20. After the ion implantation, the PW2 resist mask pattern M14 is removed by ashing and the substrate is subjected to a cleaning operation in some embodiments.

Figure 14:
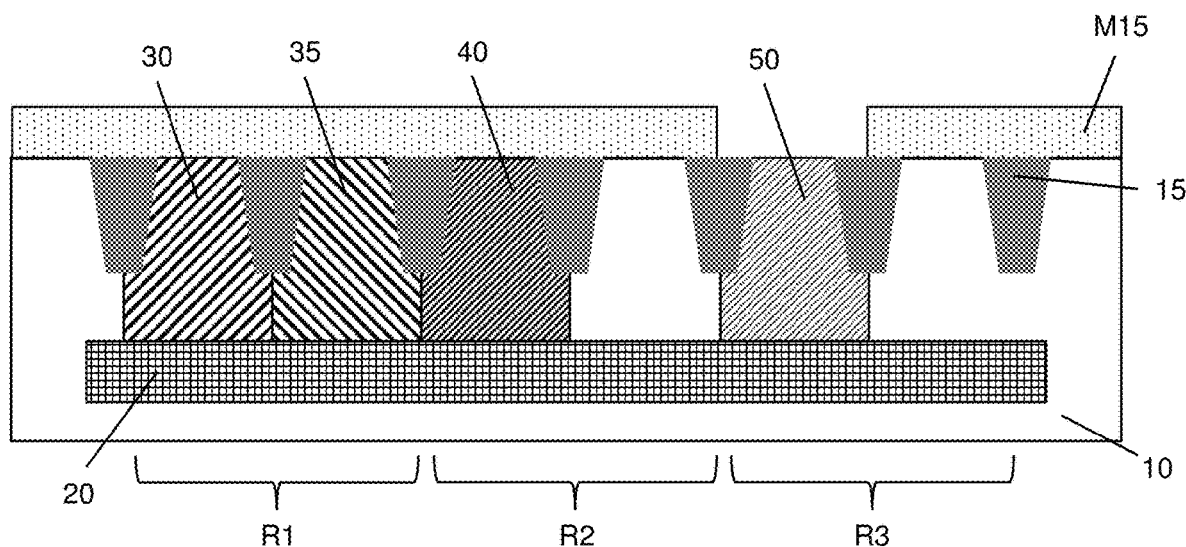

FIG. 14 is an exemplary cross sectional view of one of the stages of manufacturing semiconductor device according to one embodiment of the present disclosure.

After the PW2 40 is formed, a third p-well 50 (PW3) is formed in the third voltage device region R3, by a PW3 ion implantation using a PW3 resist mask pattern M15.

The PW3 50 is doped with one or more of B and BF2, and the ions thereof are implanted at an acceleration voltage in a range from about 10 KeV to about 1 MeV, in some embodiments. A dose amount is in a range from about $1.0 \times 10^{12}$ cm$^{-2}$ to about $1.0 \times 10^{14}$ cm$^{-2}$ in some embodiments. The PW3 50 is formed to a depth of about 0.5-2.0 μm from the surface of the substrate 10 in some embodiments. As shown in FIG. 14, the PW3 50 is in contact with the first deep well 20. After the ion implantation, the PW3 resist mask pattern M15 is removed by ashing and the substrate is subjected to a cleaning operation in some embodiments.

Figure 15:
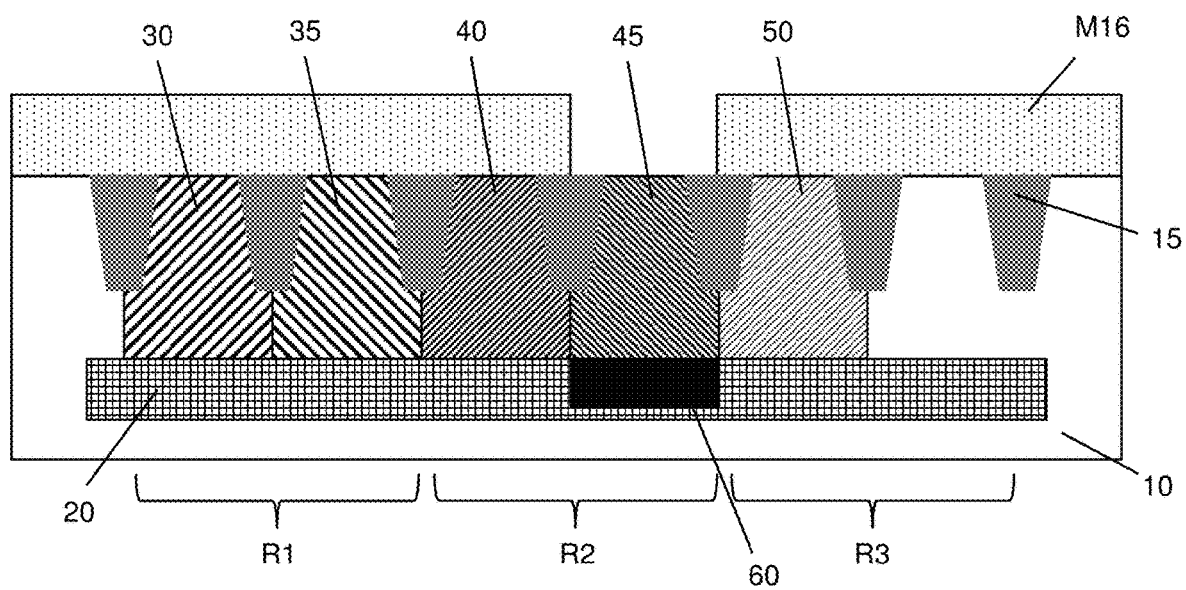

FIG. 15 is an exemplary cross sectional view of one of the stages of manufacturing semiconductor device according to one embodiment of the present disclosure.

After the PW3 50 is formed, a second deep well 60 (DPW1) having the second conductivity type is formed in the second voltage device region R2, by a DPW1 ion implantation using a DPW1-NW2 resist mask pattern M16, as shown in FIG. 15.

The DPW1 60 is doped with one or more of B and BF2, and the ions thereof are implanted at an acceleration voltage in a range from about 100 KeV to about 3 MeV, in some embodiments. A dose amount is in a range from about $1.0 \times 10^{11}$ cm$^{-2}$ to about $1.0 \times 10^{14}$ cm$^{-2}$ in some embodiments. The DPW1 60 is formed at a depth of about 1.0-4.0 μm from the surface of the substrate 10 in some embodiments.

Further, after the DPW1 ion implantation using the DPW1-NW2 resist mask pattern M16, NW2 ion implantation is performed by using the same resist mask pattern M16 (without removing), thereby forming a second n-well 45 (NW2) in the second voltage device region R2.

The NW2 45 is doped with one or more of P, As and Sb, and the ions thereof are implanted at an acceleration voltage in a range from about 10 KeV to about 1 MeV, in some embodiments. A dose amount is in a range from about $1.0 \times 10^{12}$ cm$^{-2}$ to about $1.0 \times 10^{14}$ cm$^{-2}$ in some embodiments. The NW2 45 is formed at a depth of about 0.5-2.0 μm from the surface of the substrate 10 in some embodiments. As shown in FIG. 15, the NW2 45 is in contact with the first deep well 20.

As shown in FIG. 15, the DPW1 60 is in contact with the NW2 45 and the DNW 20, and thus the NW2 45 is separated by the DPW1 60 from the DNW 20.

In some embodiments, the bottom of the DPW1 60 is shallower than the bottom of the DNW 20. In certain embodiments, the bottom of the DPW1 60 is equal to or deeper than the bottom of the DNW 20. After the ion implantation, the resist mask pattern M16 is removed by ashing and the substrate is subjected to a cleaning operation in some embodiments.

Figure 16:
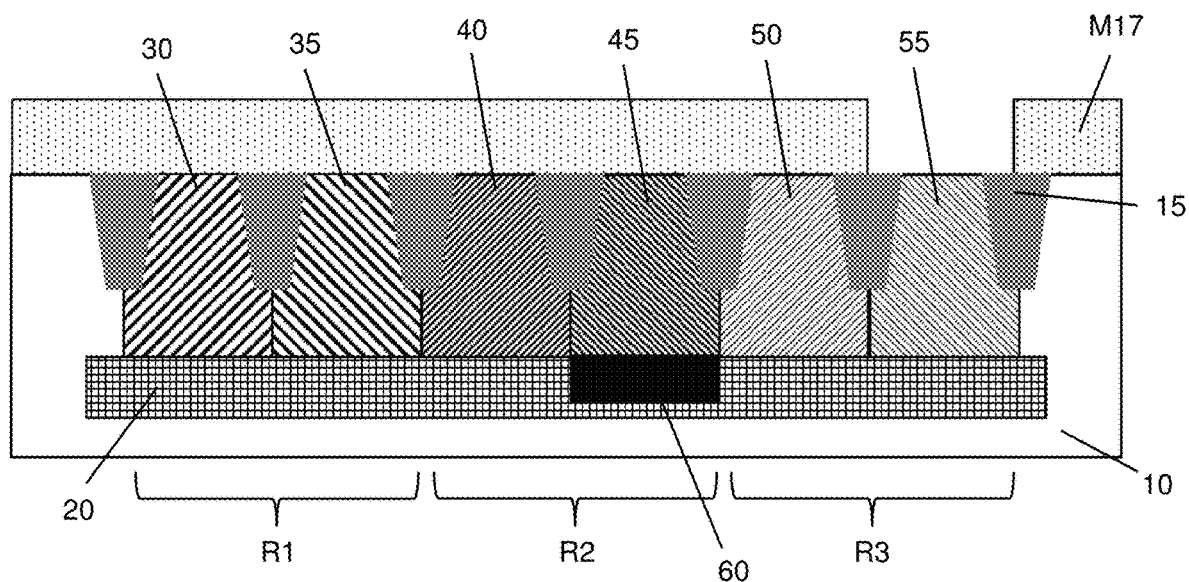

FIG. 16 is an exemplary cross sectional view of one of the stages of manufacturing semiconductor device according to one embodiment of the present disclosure.

After the DPW1 60 and NW2 45 are formed, a third n-well 55 (NW3) is formed in the third voltage device region R3, by an NW3 ion implantation using an NW3 resist mask pattern M17.

The NW3 55 is doped with one or more of P, As and Sb, and the ions thereof are implanted at an acceleration voltage in a range from about 10 KeV to about 1 MeV, in some embodiments. A dose amount is in a range from about $1.0 \times 10^{12}$ cm$^{-2}$ to about $1.0 \times 10^{14}$ cm$^{-2}$ in some embodiments. The NW3 55 is formed to a depth of about 0.5-2.0 μm from the surface of the substrate 10 in some embodiments. As shown in FIG. 16, the NW3 55 is in contact with the first deep well 20. After the ion implantation, the resist mask pattern M17 is removed by ashing and the substrate is subjected to a cleaning operation in some embodiments.

Figure 17:
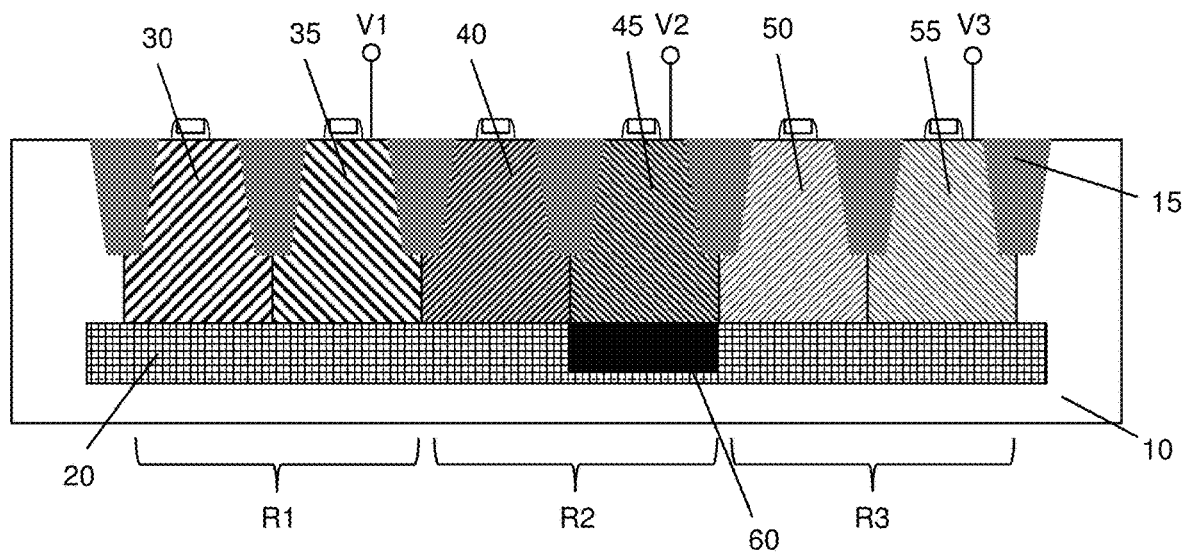

As shown in FIG. 17, the NW3 55 is electrically connected a positive power supply V3, the NW2 45 is electrically connected a positive power supply V2, and the NW1 35 is electrically connected a positive power supply V1, where V1<V2<V3. In FIG. 17, since the DPW1 60 is disposed between the NW2 45 and the DNW 20, the NW2 45 is electrically separated from the NDW 20 and the NW1 35 (an n-p-n structure). Thus, even if V2 is higher than V1, no current flows from the NW2 45 toward the NW1 35. Similarly, since there is an n-p-n structure between the NW2 45 and NW3 55, even if V3 is higher than V2, no current flows from the NW3 55 toward the NW2 45. In this configuration, however, there may be a current flow from NW3 55 toward NW1 35.

Figure 18:
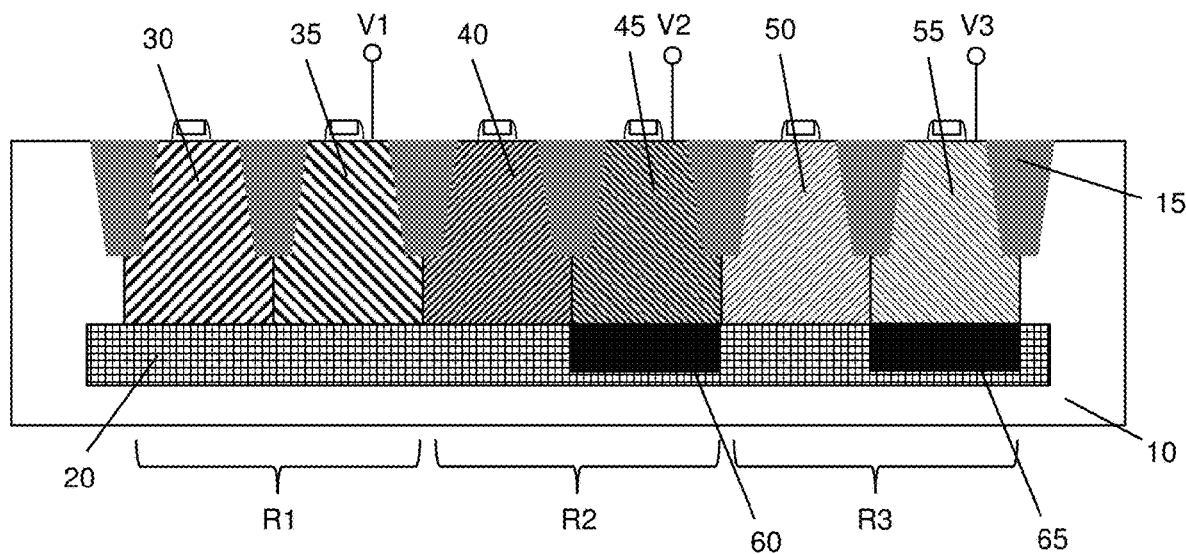
FIG. 18 shows an exemplary cross sectional view of a semiconductor device having multiple operation voltages according to another embodiment of the present disclosure.

FIG. 18 shows an exemplary cross sectional view of a semiconductor device having multiple operation voltages according to another embodiment of the present disclosure.

In certain embodiments, before the NW3 ion implantation by using the NW3 resist mask pattern M17, a DPW2 ion implantation is performed by using the same resist mask pattern M17, thereby forming a third deep well 65 (DPW2) having the second conductivity type. In other words, the DPW2 is formed by the DPW2 ion implantation using the NW3 resist mask pattern and then the NW3 is formed by the NW3 ion implantation using the same NW3 resist mask pattern (without removing).

The DPW2 65 is doped with one or more of B and BF2, and the ions thereof are implanted at an acceleration voltage in a range from about 100 KeV to about 3 MeV, in some embodiments. A dose amount is in a range from about $1.0 \times 10^{11}$ cm$^{-2}$ to about $1.0 \times 10^{14}$ cm$^{-2}$ in some embodiments. The DPW2 65 is formed at a depth of about 1.0-4.0 μm from the surface of the substrate 10 in some embodiments.

As shown in FIG. 18, the DPW2 65 is in contact with the NW3 55 and the DNW 20, and thus the NW3 55 is separated by the DPW2 65 from the DNW 20.

In some embodiments, the bottom of the DPW2 65 is shallower than the bottom of the DNW 20. In certain embodiments, the bottom of the DPW2 65 is equal to or deeper than the bottom of the DNW 20.

As shown in FIG. 18, the NW3 55 is electrically connected to a positive power supply V3, the NW2 45 is electrically connected to a positive power supply V2, and the NW1 35 is electrically connected to a positive power supply V1, where V1<V2<V3. In FIG. 18, since the DPW1 60 is disposed between the NW2 45 and the DNW 20, the NW2 45 is electrically separated from the NDW 20 and the NW1 35 (an n-p-n structure). Thus, even if V2 is higher than V1, no current flows from the NW2 45 toward the NW1 35. Similarly, since the DPW2 65 is disposed between the NW3 55 and the DNW 20, even if V3 is higher than V2, no current flows from the NW3 55 toward the NW2 45. In addition, since the DPW2 65 is disposed between the NW3 55 and the DNW 20, the NW3 55 is electrically separated from the DNW 20 and the NW1 35 (by an n-p-n structure). Thus, even if V3 is higher than V1, no current flows from the NW3 55 toward the NW1 35 in the configuration of FIG. 18.

In the foregoing operations, a thickness of the resist mask patterns M11, M16 and M17 are greater than a thickness of each of the resist mask patterns M12-M15, because a higher implantation energy is required to form deep wells than first and second wells. If the DPW2 65 is not formed, the thickness of the resist mask pattern M17 is not necessarily thicker than the resist mask patterns M12-M15.

A thickness of the resist mask pattern M16 can be equal to or greater than a thickness of the resist mask pattern M14. In view of the implantation energy, the resist mask pattern M14 can be as thin as the thickness of the resist mask patterns M12 and M13. However, since sizes of the devices in the second voltage device region R2 is generally larger than those in the first voltage device region R1 and/or a density of the devices in the second voltage device region R2 is generally smaller than those in the first device voltage region R1, the resist mask pattern for the second device voltage region R2 can be larger (coarser) than that for the first device voltage region R1. Accordingly, it is possible to set the thickness of the resist mask pattern M14 greater or equal to the resist mask pattern M16.

Similarly, a thickness of the resist mask pattern M17 can be equal to or greater than a thickness of the resist mask pattern M15. In view of the implantation energy, the resist mask pattern M15 can be as thin as the thickness of the resist mask patterns M12-M14. However, since the sizes of the devices in the third voltage device region R3 are generally larger than those in the first and second voltage device region R1 and R2 and/or a density of the devices in the third voltage device region R3 is generally smaller than those in the first and second device voltage region R1 and R2 the resist mask pattern for the third device voltage region R3 can be larger (coarser) than that for the first and second device voltage regions R1 and R2. Accordingly, it is possible to set the thickness of the resist mask pattern M15 greater or equal to the resist mask pattern M17.

By the same reasons, the thickness of the resist mask pattern M17 for the third device voltage region R3 can be set thicker. Accordingly, the same mask pattern M17 can be used for a relatively low energy ion implantation for NW3 55 and a relatively high energy ion implantation DPW2 65.

In the foregoing embodiments, the ion implantations for DNW, PW1, NW1, PW2, PW3, DPW1, NW2, and NW3 (and DPW2 prior to NW3) are performed in this order. However, the order of the ion implantation is not limited to this. For example, the order of the ion implantations for PW1, NW1, PW2 and PW3 can be any order, while the ion implantation for the DNW is performed generally prior to the other ion implantations, and the DPW1 ion implantation is performed just before the NW2 ion implantation.

When DPW2 is formed, the ion implantation for DPW1, NW2, DPW2 and NW3 are performed after the ion implantations for PW1, NW1, PW2 and PW3. If DPW2 is not formed, the order of the ion implantations for PW1, NW1, PW2, PW3 and NW3 can be any order, and the ion implantation for DPW1 and NW2 are performed after the ion implantations for PW1, NW1, PW2, PW3 and NW3.

In the foregoing embodiments, the ion implantations for NW2 and DPW1 utilize the same resist mask pattern. However, it is possible to use a separate resist mask pattern for the DPW1 ion implantation. In such a case, the ion implantations for DNW and DPW1 are performed prior to PW1, NW1, PW1, NW2, PW3 and NW3 ion implantations. In some embodiments, the DNW implantation is performed prior to the DPW1 ion implantation. Similarly, although the ion implantations for NW3 and DPW2 utilize the same resist mask pattern, it is possible to use a separate resist mask pattern for the DPW2 ion implantation. In such a case, the ion implantations for DNW, DPW1 and DPW2 are performed prior to PW1, NW1, PW1, NW2, PW3 and NW3 ion implantations. In some embodiments, the DNW implantation is performed prior to the DPW1 and DPW2 ion implantation.

Figure 19:
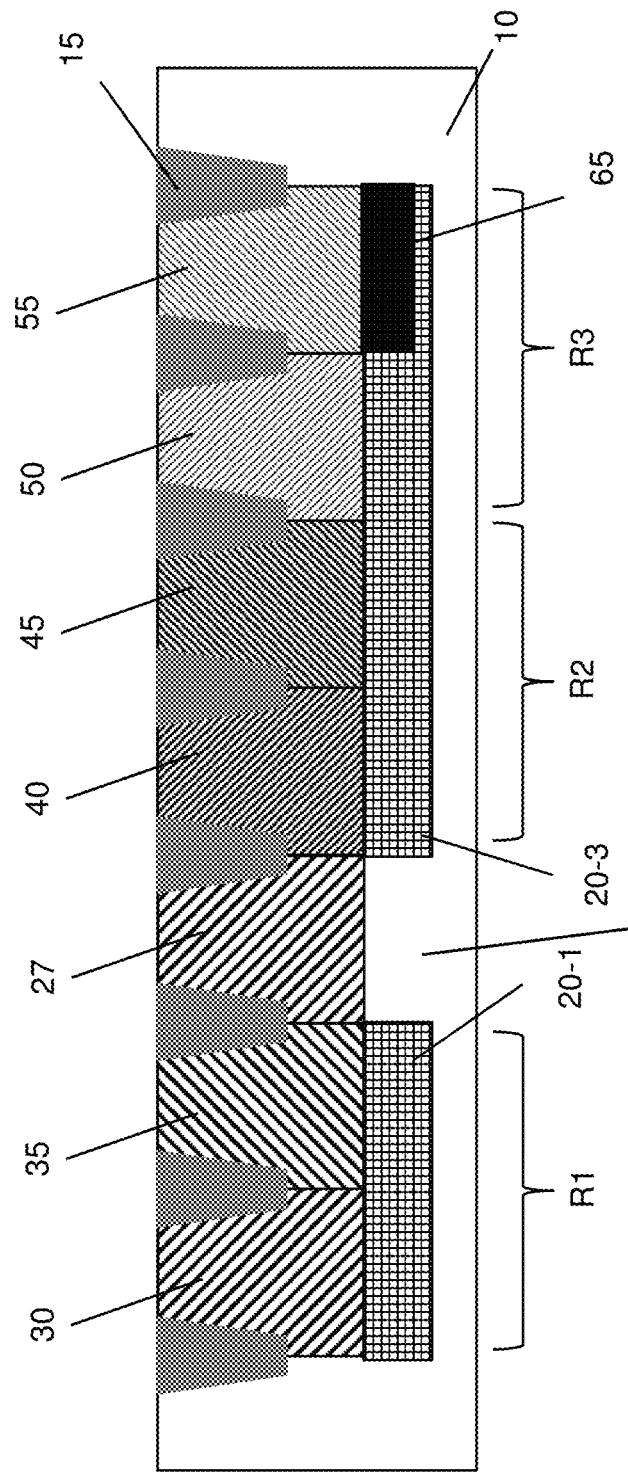
FIG. 19 shows an exemplary cross sectional view of a semiconductor device having multiple operation voltages according to another embodiment of the present disclosure.

FIG. 19 shows an exemplary cross sectional view of a semiconductor device having multiple operation voltages according to another embodiment of the present disclosure.

As set forth above, different device voltage regions can be electrically separated by either a deep well (e.g., DPW, DPW1 and DPW2) or a space region SP separating a deep well (DNW). In FIG. 19, NW1 35 in the first device voltage region R1 and NW2 45 in the second voltage device region R2 are electrically separated by the space region SP (p-type substrate) that separates the n-type deep well 20-1 disposed in the first device voltage region R1 and the n-type deep well 20-3 disposed commonly in the second and third device voltage region R2 and R3. NW2 45 the second voltage device region R2 and NW3 55 in the third voltage device region R3 are electrically separated by the p-type deep well PDW2 65.

In certain embodiments, NW2 45 in the second voltage device region R2 and NW3 55 in the third voltage device region R3 can be electrically separated by a space region, while NW1 35 in the first device voltage region R1 and NW2 45 in the second voltage device region R2 are electrically separated by the p-type deep well DPW1 60.

In the foregoing embodiments, the same resist mask pattern can be utilized in an ion implantation for a first conductivity type well in the higher device voltage region and an ion implantation for a second conductivity type deep well below the first conductivity type well. Accordingly, a well separation structure can be formed without using an extra photo lithography operation. Further, it is possible to reduce the device area up to 40%.

It will be understood that not all advantages have been necessarily discussed herein, no particular advantage is required for all embodiments or examples, and other embodiments or examples may offer different advantages.

In accordance with one aspect of the present disclosure, a method for manufacturing a semiconductor device is disclosed. The semiconductor device includes a first voltage device region and a second voltage device region, wherein an operation voltage of electronic devices in the second voltage device region is higher than an operation voltage of electronic devices in the first voltage device region. In the method, a first deep well having a first conductivity type is formed in the first and second voltage device regions of a substrate, by a first ion implantation using a first resist mask. A first well having a second conductivity type is formed in the first voltage device region, by a second ion implantation using a second resist mask. A second well having the first conductivity type is formed in the first voltage device region by a third ion implantation using a third resist mask. A third well having the second conductivity type is formed in the second voltage device region, by a fourth ion implantation using a fourth resist mask. A second deep well having the second conductivity type is formed below the fourth well and in the first deep well by a fifth ion implantation using a fifth resist mask. A fourth well having the first conductivity type is formed in the second voltage device region, by a sixth ion implantation.

In accordance with another aspect of the present disclosure, a method for manufacturing a semiconductor device is disclosed. The semiconductor device includes a first voltage device region, a second voltage device region and a third voltage device region. An operation voltage of electronic devices in the second voltage device region is higher than an operation voltage of electronic devices in the first voltage device region and lower than an operation voltage of electronic devices in the third voltage device region. In the method, a first deep well having a first conductivity type is formed in the first to third voltage device regions of a substrate, by a first ion implantation using a first resist mask. A first well having a second conductivity type is formed in the first voltage device region, by a second ion implantation using a second resist mask. A second well having the first conductivity type is formed in the first voltage device region by a third ion implantation using a third resist mask. A third well having the second conductivity type is formed in the second voltage device region, by a fourth ion implantation using a fourth resist mask. A fourth well having the first conductivity type is formed in the second voltage device region, by a fifth ion implantation using a fifth resist mask. A fifth well having the second conductivity type is formed in the third voltage device region, by a sixth ion implantation using a sixth resist mask. A sixth well having the first conductivity type is formed in the third voltage device region, by a seventh ion implantation using a seventh resist mask. A second deep well having the second conductivity type is formed below the fourth well and in the first deep well by an eighth ion implantation. A third deep well having the second conductivity type is formed below the sixth well and in the first deep well by a ninth ion implantation.

In accordance with another aspect of the present disclosure, a semiconductor device includes a first voltage device region, a second voltage device region, and a deep well common to the first and second voltage device regions. An operation voltage of electronic devices in the second voltage device region is higher than an operation voltage of electronic devices in the first voltage device region. The deep well has a first conductivity type. The first voltage device region includes a first well having a second conductivity type and a second well having the first conductivity type. The second voltage region includes a third well having the second conductivity type and a fourth well having the first conductivity type. A second deep well having the second conductivity type is formed below the fourth well. The first, second and third wells are in contact with the first deep well, and the fourth well is separated by the second deep well from the first deep well.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first voltage device region over a substrate;
a second voltage device region over the substrate;
a third voltage device region over the substrate; and
a first deep well common to the first, second and third voltage device regions, wherein:
an operation voltage of electronic devices in the second voltage device region is higher than an operation voltage of electronic devices in the first voltage device region,
an operation voltage of electronic devices in the third voltage device region is higher than the operation voltage of the electronic devices in the second voltage device region,
the first deep well has a first conductivity type,
the first voltage device region includes a first well having a second conductivity type and a second well having the first conductivity type,
the second voltage region includes a third well having the second conductivity type and a fourth well having the first conductivity type,
the third voltage region includes a fifth well having the second conductivity type and a sixth well having the first conductivity type,
a second deep well having the second conductivity type is formed below the fourth well, a third deep well having the second conductivity type and disposed below the sixth well,
each of the first, second, third, fourth, fifth and sixth wells comprises at least one transistor,
the first, second, third and fifth wells are in contact with the first deep well, and
a bottom and sides of the second deep well are directly connected to the first deep well and a bottom and sides of the third deep well are directly connected to the first deep well.

2. The semiconductor device of claim 1, wherein the fourth well is separated by the second deep well from the first deep well.

3. The semiconductor device of claim 2, wherein a part of the first deep well is disposed below the second deep well.

4. The semiconductor device of claim 1, wherein the first conductivity type is n-type, and the second conductivity type is p-type.

5. The semiconductor device of claim 4, wherein the second well is coupled to a first voltage V1 and the fourth well is coupled to a second voltage V2, where V1<V2.

6. The semiconductor device of claim 1, wherein the first deep well is disposed at a depth in a range from 1.0 μm to 5.0 μm from a surface of the substrate.

7. The semiconductor device of claim 1, wherein the first to sixth wells is disposed at a depth in a range from 0.5 μm to 2.0 μm from a surface of the substrate.

8. The semiconductor device of claim 1, wherein the second well is coupled to a first voltage V1, the fourth well is coupled to a second voltage V2 and the sixth well is coupled to the third voltage V3, where V1<V2<V3.

9. The semiconductor device of claim 1, wherein the sixth well is separated from the first deep well by the third deep well.

10. The semiconductor device of claim 1, wherein the second voltage device region is located between the first voltage device region and the third voltage device region.

11. The semiconductor device of claim 1, wherein the second deep well is separated from third deep well by a part of the first deep well.

12. A semiconductor device comprising:
a first voltage device region over a substrate;
a second voltage device region over the substrate; and
a first deep well common to the first and second voltage device regions, wherein:
an operation voltage of electronic devices in the second voltage device region is higher than the operation voltage of electronic devices in the first voltage device region,
the first deep well has a first conductivity type,
the first voltage device region includes a first well having a second conductivity type and a second well having the first conductivity type,
the second voltage region includes a third well having the second conductivity type and a fourth well having the first conductivity type,
a second deep well having the second conductivity type is formed below the second well, a third deep well having the second conductivity type and disposed below the fourth well,
each of the first, second, third and fourth wells comprises at least one transistor,
the first and third wells are in contact with the first deep well, and
a bottom and sides of the second deep well are directly connected to the first deep well and a bottom and sides of the third deep well are directly connected to the first deep well.

13. The semiconductor device of claim 12, wherein the second deep well is separated from third deep well by a part of the first deep well.

14. The semiconductor device of claim 12, further comprising isolation insulating layers disposed between adjacent wells of the first to fourth wells.

15. The semiconductor device of claim 12, wherein the first deep well is disposed at a depth in a range from 1.0 μm to 5.0 μm from a surface of the substrate.

16. The semiconductor device of claim 12, wherein the first to sixth wells is disposed at a depth in a range from 0.5 μm to 2.0 μm from a surface of the substrate.

17. A semiconductor device comprising:
a first deep well having a first conductivity type,
a first well having the second conductivity type and directly connected to the first deep well;
a second well having the first conductivity type;
a third well having the second conductivity type and directly connected to the first deep well;
a fourth well having the first conductivity type;
a second deep well having the second conductivity type and disposed below the second well; and
a third deep well having the second conductivity type and disposed below the fourth well, wherein:
the second well is separated by the second deep well from the first deep well,
the fourth well is separated by the third deep well from the first deep well, each of the first, second, third and fourth wells comprises at least one transistor, and a bottom and sides of the second deep well are directly connected to the first deep well, and a bottom and sides of the third deep well are directly connected to the first deep well.

18. The semiconductor device of claim 17, wherein the second deep well is separated from third deep well by a part of the first deep well.

19. The semiconductor device of claim 17, further comprising isolation insulating layers disposed between adjacent wells of the first to fourth wells.

20. The semiconductor device of claim 19, wherein the first well is in contact with the second well and the third well is in contact with the fourth well below the isolation insulating layers, respectively.

\* \* \* \* \*